(12) United States Patent
Hamada et al.

(10) Patent No.: US 8,153,275 B2
(45) Date of Patent: Apr. 10, 2012

(54) ORGANIC ELECTROLUMINESCENT ELEMENT AND DISPLAY DEVICE OR LIGHT EMITTING DEVICE EQUIPPED WITH THE SAME

(75) Inventors: Yuji Hamada, Nara (JP); Haruhisa Hashimoto, Osaka (JP); Masahiro Iyori, Osaka (JP); Kazuki Nishimura, Mie (JP); Kenji Okumoto, Osaka (JP); Masaya Nakai, Osaka (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 1083 days.

(21) Appl. No.: 11/477,991

(22) Filed: Jun. 29, 2006

(65) Prior Publication Data

US 2007/0009762 A1 Jan. 11, 2007

(30) Foreign Application Priority Data

Jun. 30, 2005 (JP) ................................ 2005-193215

(51) Int. Cl.
*H01L 51/54* (2006.01)
(52) U.S. Cl. ........ 428/690; 428/917; 313/504; 313/506; 252/301.16; 257/40
(58) Field of Classification Search .................. None
See application file for complete search history.

(56) References Cited

U.S. PATENT DOCUMENTS

| | | | |
|---|---|---|---|
| 6,720,573 B2 * | 4/2004 | Son et al. | 257/40 |
| 2003/0075720 A1 * | 4/2003 | Liao et al. | 257/79 |
| 2003/0175553 A1 * | 9/2003 | Thompson et al. | 428/690 |
| 2003/0197465 A1 * | 10/2003 | Qiu et al. | 313/504 |
| 2004/0066139 A1 | 4/2004 | Hamada et al. | |
| 2004/0202893 A1 * | 10/2004 | Abe | 428/690 |

FOREIGN PATENT DOCUMENTS

| | | |
|---|---|---|
| CN | 1628491 A | 6/2005 |
| JP | 2002175887 | 6/2002 |
| JP | 2003123984 A | 4/2003 |
| JP | 2004179142 A | 6/2004 |

OTHER PUBLICATIONS

Ren et al. "Ultrahigh energy gap hosts in deep blue organic electrophosphorescent devices." Chem. Mater. 2004, vol. 16, pp. 4743-4747.*

* cited by examiner

*Primary Examiner* — Jennifer Chriss
*Assistant Examiner* — Michael H Wilson
(74) *Attorney, Agent, or Firm* — Masuvalley & Partners

(57) ABSTRACT

It is an object of the present invention to provide an organic electroluminescent element having a longer lifetime. In order to accomplish the object, an organic electroluminescent element adapted to comprise a light emitting layer including an organic material between an anode and a cathode is provided with a hole transport layer for transporting holes injected from the anode toward the light emitting layer. Along with the hole transport layer, an intermediate layer having an energy level of a lowest unoccupied molecular orbital lower than those of the hole transport layer and the light emitting layer is provided therebetween.

10 Claims, 3 Drawing Sheets

ORGANIC ELECTROLUMINESCENT ELEMENT AND DISPLAY DEVICE OR LIGHT EMITTING DEVICE EQUIPPED WITH THE SAME

TECHNICAL FIELD

The present invention relates to an organic electroluminescent element and a display device or a light emitting device equipped with the element.

BACKGROUND OF INVENTION

In recent years, with the diversification of information equipment, demands for a flat-panel display element that enables lower power consumption compared to a generally used CRT (cathode-ray tube) have been increasing. As one of such flat-panel display elements, an organic electroluminescent element (hereinafter referred to as an "organic EL element") characterized by high-efficiency, flat-shape, light-weight, and low dependence on a view angle is attracting attentions.

A currently well-known organic EL element has a layered structure in which between a hole injection electrode (anode) and an electron injection electrode (cathode), a hole transport layer for transporting holes injected from the anode, a light emitting layer for emitting light by facilitating to recombine holes transported through the hole transport layer with electrons, and an electron transport layer for transporting electrons received from the cathode toward the light emitting layer are sequentially stacked. A known example of such an organic EL element includes that disclosed in Japanese Published Unexamined Patent Publication No. 2004-179142.

In an organic EL element having the above-described structure, because the recombination between electrons and holes in the light emitting layer causes the generation of light having a certain wavelength, it is desirable that the number of electrons supplied from the cathode to the light emitting layer and that of holes supplied from the anode to the light emitting layer are adequately large in order to obtain sufficient emission brightness.

However, as the number of electrons supplied to the light emitting layer becomes larger, excess electrons that do not contribute to the recombination in the light emitting layer are generated, and if the excess electrons get into the hole transport layer, the electrons may negatively affect organic materials comprising the hole transport layer.

For example, in an organic EL element, an amine derivative such as a triaryl amine derivative is generally used as a material for the hole transport layer for transporting holes injected from the anode. However, in the case where the amine derivative is used, electrons affect nitrogen in the amine to thereby destroy a molecular structure, whereby a hole transport capacity is deteriorated, resulting in the disadvantage of a shorter lifetime of the organic EL element.

It is therefore an object of the present invention to increase the lifetimes of an organic EL element and a display device or a light emitting device equipped with the element.

BRIEF SUMMARY OF THE INVENTION

An organic electroluminescent element comprising a light emitting layer including an organic material between an anode and a cathode is characterized by comprising a hole transport layer provided between the anode and the light emitting layer, and an intermediate layer provided between the hole transport layer and the light emitting layer, wherein the intermediate layer has an energy level of a lowest unoccupied molecular orbital lower than energy levels of lowest unoccupied molecular orbitals of the hole transport layer and the light emitting layer.

The above-described organic electroluminescent element is, without being limited, sequentially provided with the anode, the hole transport layer for facilitating the transport of holes, the intermediate layer, the light emitting layer, and the cathode. This allows electrons to be injected from the cathode into the light emitting layer and holes to be injected from the anode into the light emitting layer while the organic electroluminescent element is activated. As a result, the electrons and holes are recombined in the light emitting layer, whereby the light emitting layer emits light.

In such a case, the lowest unoccupied molecular orbital (LUMO) of the intermediate layer has a lower level than the LUMOs of the hole transport layer and the light emitting layer. This allows the excess electrons passing through the light emitting layer to be trapped in the intermediate layer. As a result, the number of electrons moving into the hole transport layer can be decreased, whereby the deterioration of the hole transport layer is inhibited, resulting in the increase in lifetime of the organic electroluminescent element.

In addition, the difference in energy level between a highest occupied molecular orbital (HOMO) of the light emitting layer and the LUMO of the intermediate layer is configured to be approximately 1.5 eV or less.

In such a case, the difference in energy level between the LUMO of the intermediate layer and the HOMO of the light emitting layer adjacent to the intermediate layer is small, and therefore electrons are attracted from the light emitting layer by the intermediate layer, whereby holes are generated in the light emitting layer. The holes are then recombined with electrons in the light emitting layer, whereby the light emitting layer emits light. A light emitting efficiency is thus improved, as well as the recombination of holes and electrons in the light emitting layer is facilitated, so that the number of the excess electrons can be reduced, contributing to the inhibition of deteriorating the hole transport layer.

Also, a hole injection layer may be further provided between the anode and the hole transport layer to inject holes from the anode to the hole transport layer, and the difference in energy level between HOMO of the hole transport layer and LUMO of the hole injection layer may be configured to be approximately 1.5 eV or less.

The difference in energy level between the LUMO of the hole injection layer and the HOMO of the hole transport layer is small, and therefore electrons are attracted from the hole transport layer by the hole injection layer, whereby holes are generated in the hole transport layer. The holes then move into the light emitting layer via an electric field generated in the organic electroluminescent element of the present invention and are recombined with electrons in the light emitting layer, whereby the light emitting layer emits light. Therefore, the light emitting efficiency is improved, and the reduction in the number of excess electrons also contributes to the reduction in deterioration of the hole transport layer.

In addition, the intermediate layer and the hole injection layer may be comprised of a same material.

In such a case, it is not necessary to prepare different materials for the intermediate layer and the hole injection layer, so that the number of materials can be reduced, and also a single piece of deposition apparatus can be interchangeably used for both formations of the intermediate layer and the hole injection layer. Consequently, this can contribute to the reduction in production cost.

An organic electroluminescent element is characterized by comprising an anode, a hole transport layer including an amine derivative, a light emitting layer, an electron transport layer, and an intermediate layer provided between the hole transport layer and the light emitting layer, wherein the intermediate layer at least includes a pyrazine derivative having a molecular structure shown by formula (1).

Formula (1)

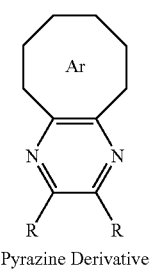

(1)

Pyrazine Derivative
Ar: aryl
R: ——H, ——CnH2n+1 (n = 1~10)
——OCnH2n+1 (n = 1~10),
——N(CnH2n+1)2 (n = 1~10),
——X(X = F, Cl, Br, I), ——CN, Further, the pyrazine derivative may be configured to at least include a material having a molecular structure shown by formula (2).

Formula (2)

Formula (2)

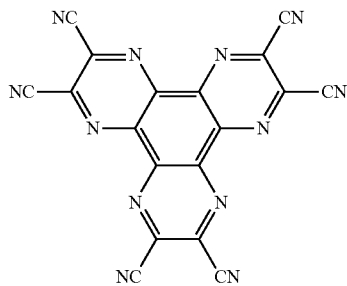

(2)

The material having the molecular structure shown by formula (2) has a lower LUMO energy level, and if it is used as the intermediate layer, the LUMO of the intermediate layer may be configured to be a level lower than LUMOs of the hole transport layer and the light emitting layer. This also allows the intermediate layer to trap electrons having passed through the light emitting layer. The trapping of the electrons results in the decrease in the number of electrons moving from the light emitting layer into the hole transport layer via the intermediate layer. As a result, the deterioration of the hole transport layer including the amine derivative due to electrons is reduced, whereby a lifetime of the organic electroluminescent element is increased.

An organic electroluminescent element is characterized by comprising an anode, a hole transport layer including an amine derivative, a light emitting layer, an electron transport layer, and an intermediate layer provided between the hole transport layer and the light emitting layer, wherein the intermediate layer at least includes a material having a molecular structure shown by formula (3).

Formula (3)

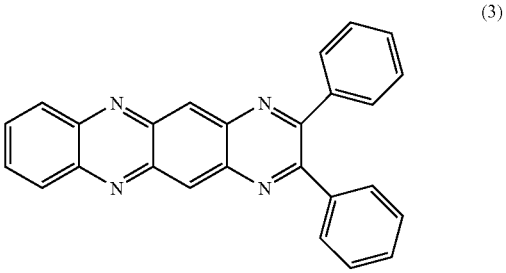

(3)

A pyrazine derivative having the molecular structure shown by formula (3) has a lower LUMO energy level, and if it is used as the intermediate layer, the LUMO of the intermediate layer may be configured to be a level lower than LUMOs of the hole transport layer and the light emitting layer. This also allows the intermediate layer to trap electrons having passed through the light emitting layer. The trapping of the electrons results in the decrease in the number of electrons moving from the light emitting layer into the hole transport layer via the intermediate layer. As a result, the deterioration of the hole transport layer including the amine derivative due to electrons is reduced, whereby a lifetime of the organic electroluminescent element is increased.

Also, a display device may be configured using one or more of the above-described organic electroluminescent elements. In such a case, the display device may be characterized in that the difference in energy level between HOMO of the light emitting layer and LUMO of the intermediate layer is approximately 1.5 eV or less.

Further, a light emitting device may be configured using one or more of the above-described organic electroluminescent elements. In such a case, the light emitting device may be characterized in that the difference in energy level between HOMO of the light emitting layer and LUMO of the intermediate layer is approximately 1.5 eV or less.

DETAILED DESCRIPTION OF THE INVENTION

An organic electroluminescent (hereinafter referred to as an "organic EL") element and a display device or a light emitting device equipped with the element according to the present invention will hereinafter be described with reference to the drawings.

Figure 1:
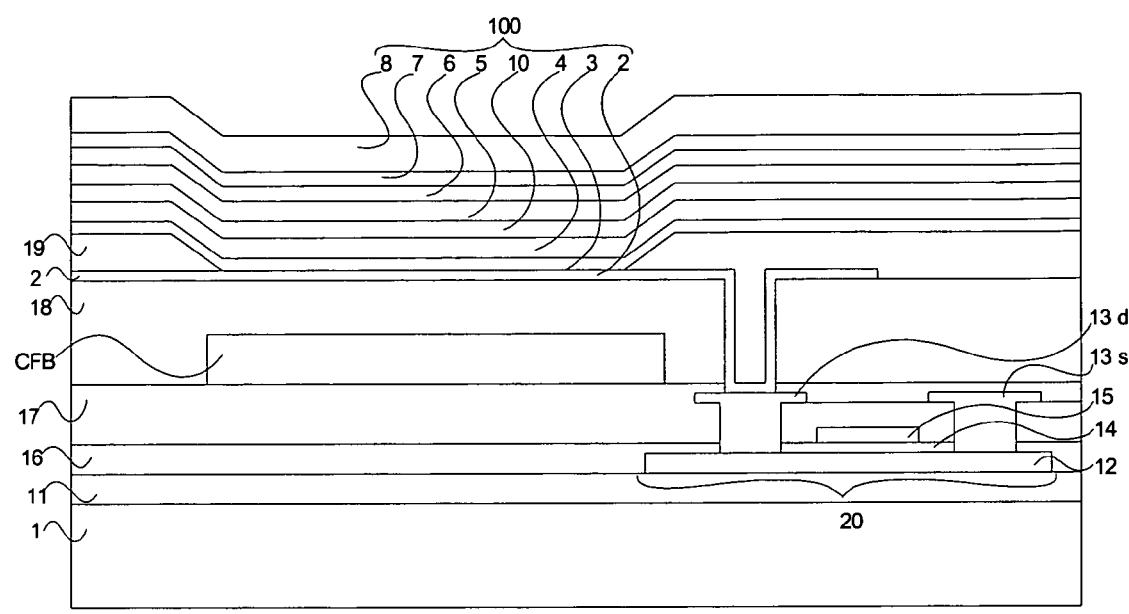
FIG. 1 is a schematic cross-sectional view illustrating an organic EL element according to one embodiment of the present invention.

FIG. 1 is a cross-sectional view illustrating the organic EL element comprising one pixel of the display device equipped with the organic EL element according to an embodiment.

As shown in FIG. 1, a layered film 11 comprised of, for example, a silicon oxide ($SiO_2$) layer and a silicon nitride ($SiN_x$) layer is formed on a transparent substrate 1 made of glass, plastic, or the like.

A TFT (thin film transistor) 20 is formed on a part of the layered film 11. The TFT 20 is comprised of a channel region 12, a drain electrode 13d, a source electrode 13s, a gate oxide film 14, and a gate electrode 15.

For example, the channel region 12 comprised of a polysilicon layer or the like is formed on a part of the layered film 11. On the channel region 12, the drain electrode 13d and the source electrode 13s are formed. Also, on the channel region 12, the gate oxide film 14 is formed. The gate electrode 15 is formed on the gate oxide film 14.

The drain electrode 13d of the TFT 20 is connected to an anode 2 described later, and the source electrode 13s of the TFT 20 is connected to a power line (not shown).

A first interlayer insulation film 16 is formed on the gate oxide film 14 so as to cover the gate electrode 15. A second interlayer insulation film 17 is formed on the first interlayer insulation film 16 so as to cover the drain electrode 13d and the source electrode 13s. The gate electrode 15 is connected to an electrode (not shown).

In addition, the gate oxide film 14 has a layered structure comprised of, for example, a silicon nitride layer and a silicon oxide layer. Also, the first interlayer insulation film 16 has a layered structure comprised of, for example, a silicon oxide layer and a silicon nitride layer, and the second interlayer insulation film 17 is comprised of, for example, silicon nitride.

On the second interlayer insulation film 17, a red color filter layer CFR, a green color filter layer CFG, and a blue color filter layer CFB are respectively formed. The red color filter layer CFR transmits light in a red wavelength region, the green color filter layer CFG transmits light in a green wavelength region, and the blue color filter layer CFB transmits light in a blue wavelength region. In addition, FIG. 1 exemplifies the blue color filter layer CFB. The blue color filter layer CFB preferably transmits 70% or more, and more preferably 80% or more of an amount of light in a wavelength region of 400 nm to 530 nm.

On the second interlayer insulation film 17, a first planarizing layer 18 comprised of, for example, an acrylic resin is formed so as to cover the red color filter layer CFR, the green color filter layer CFG, and the blue color filter layer CFB.

An organic EL element 100 is formed on the first planarizing layer 18. The organic EL element 100 sequentially comprises the anode 2, a hole injection layer 3, a hole transport layer 4, an orange light emitting layer 5, a blue light emitting layer 6, an electron transport layer 7, and a cathode 8, and an intermediate layer 10 is provided between the hole transport layer 4 and the orange light emitting layer 5. The anode 2 is formed on the first planarizing layer 18 for each of pixels, and an insulating second planarizing layer 19 is formed in an area between the pixels so as to cover the edges of the anode 2. In addition, as the anode 2, a double layer structure comprised of a transparent metal oxide film such as indium tin oxide (ITO) and $CF_x$ (carbon fluoride) formed by a plasma CVD method (a plasma chemical vapor deposition method) is used.

The hole injection layer 3 is comprised of an organic material such as Hexaazatriphenylenehexacarbonitrile (hereinafter referred to as "HAT-CN6") shown below by formula (2). Alternatively, an organic material such as 2,3-Diphenyl-1,4,6,11-Tetraaza-Naphthacene (hereinafter referred to as "DTN") shown below by formula (3) may be used.

HAT-CN6 has a LUMO level of 4.4 eV (LUMO level is hereinafter expressed as an absolute value) and a HOMO level of 7.0 eV (HOMO level is hereinafter expressed as an absolute value). Also, DTN has a LUMO level of 3.9 eV and a HOMO level of 6.5 eV. Note that LUMO and HOMO levels are expressed as absolute values respectively, and therefore a smaller energy value of LUMO or HOMO indicates a higher level.

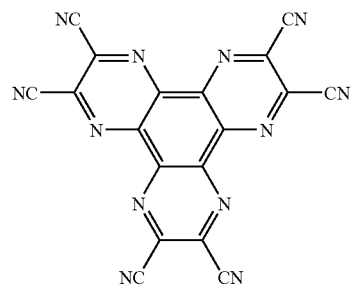

(2)

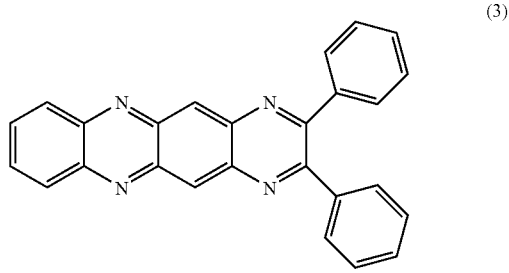

(3)

On the hole injection layer 3, the hole transport layer 4, the intermediate layer 10, the orange light emitting layer 5, the blue light emitting layer 6, and the electron transport layer 7 are sequentially formed. Further, on the electron transport layer 7, the cathode 8 comprised of, for example, aluminum or the like is formed.

For the hole transport layer 4, an amine derivative such as N,N'-Di(1-naphthyl)-N,N'-diphenyl-benzidine (hereinafter referred to as "NPB") shown by the following formula (4) is used. When the amine derivative represented by NPB receives electrons, its molecular structure becomes extremely unstable, leading to the deterioration of its hole transport capacity.

NPB has a LUMO level of 2.6 eV and a HOMO level of 5.4 eV. Note that a smaller energy value of LUMO indicates a higher level.

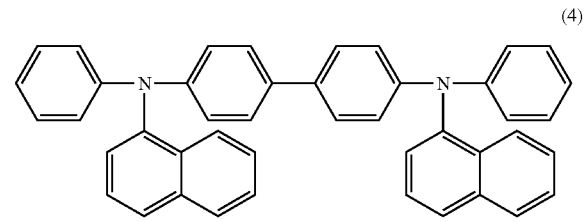

(4)

In this embodiment, an amine derivative shown by the following formula (5), as represented by the above-described NPB, may be used for the hole transport layer 4.

(5)

In formula (5), Ar1 to Ar3 respectively represent aromatic substitution groups, and may be same as or different from one another.

Also, in this embodiment, the hole transport layer 4 is comprised of, for example, an organic material such as 4,4', 4"-tris(3-methylphenylphenylamino)triphenylamine (hereinafter referred to as "MTDATA") shown by the following formula (6).

MTDATA has a LUMO level of 2.5 eV and a HOMO level of 5.0 eV.

(6)

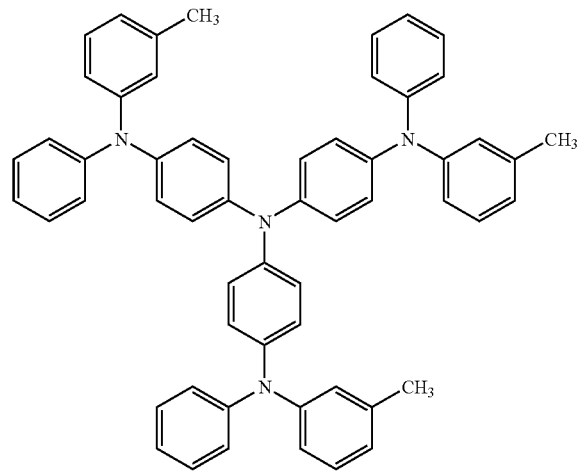

A material for the intermediate layer 10 preferably has a LUMO level lower than that of a material including the amine derivative used for the hole transport layer 4, and also lower than that of a material used for the light emitting layer (orange light emitting layer 5).

In this embodiment, the intermediate layer 10 is, for example, a pyrazine derivative having a molecular structure shown by the following formula (1), and preferably HAT-CN6 or DTN may be used for the layer 10, similarly to the above-described hole injection layer.

(1)

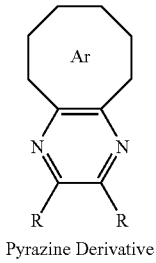

Pyrazine Derivative

Ar: aryl
R: ——H, ——CnH2n+1 (n = 1~10)
——OCnH2n+1 (n = 1~10),
——N(CnH2n+1)2 (n = 1~10),
——X(X = F, Cl, Br, I), ——CN , HAT-CN6 has a LUMO level of 4.4 eV and a HOMO level of 7.0 eV. Also, DTN has a LUMO level of 3.9 eV and a HOMO level of 6.5 eV.

The orange light emitting layer 5 is formed using, for example, NPB as a host material, 5,12-Bis(4-tert-butylphenyl)-naphthacene (hereinafter referred to as "tBuDPN") shown by the following formula (7) as a first dopant, and 5,12-Bis(4-(6-methylbenzothiazol-2-yl)phenyl)-6,11-diphenylnaphthacene (hereinafter referred to as "DBzR") shown by the following formula (8) as a second dopant.

Also, the orange light emitting layer 5 may comprise the above-described MTDATA as the host material along with the same first and second dopants as above.

In this case, the second dopant functions to emit light, and the first dopant functions to transport electrons in the orange light emitting layer 5. The host material NPB has a hole transport property, and therefore in order to cover its poor electron transport property, the first dopant is incorporated. This allows a carrier balance between holes and electrons in the orange light emitting layer 5 to be maintained, whereby the recombination can be facilitated. The orange light emitting layer 5 generates orange light, which originates from the second dopant, having a peak wavelength larger than 500 nm and smaller than 650 nm.

tBuDPN has a LUMO level of 3.1 eV and a HOMO level of 5.4 eV. DBzR has a LUMO level of 3.1 eV and a HOMO level of 5.2 eV.

(7)

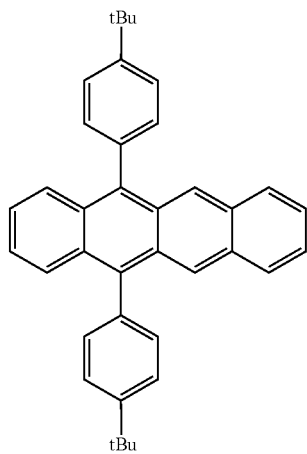

(8)

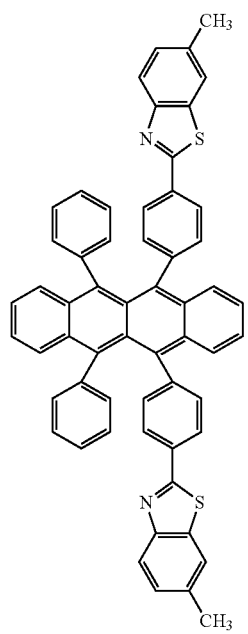

The blue light emitting layer 6 may be formed using, for example, 2,6-di(t-butyl)-9,10-di(2-naphthyl)anthracene (hereinafter referred to as "TBADN") shown by the following formula (9) as a host material, NPB as a first dopant, and 1,4,7,10-Tetra-tert-butylPerylene (hereinafter referred to as "TBP") shown by the following formula (10) as a second dopant. In this case, the second dopant emits light, and the first dopant functions to support the light emission from the second dopant by facilitating a carrier transport. Consequently, the blue light emitting layer 6 generates blue light having a peak wavelength larger than 400 nm and smaller than 500 nm.

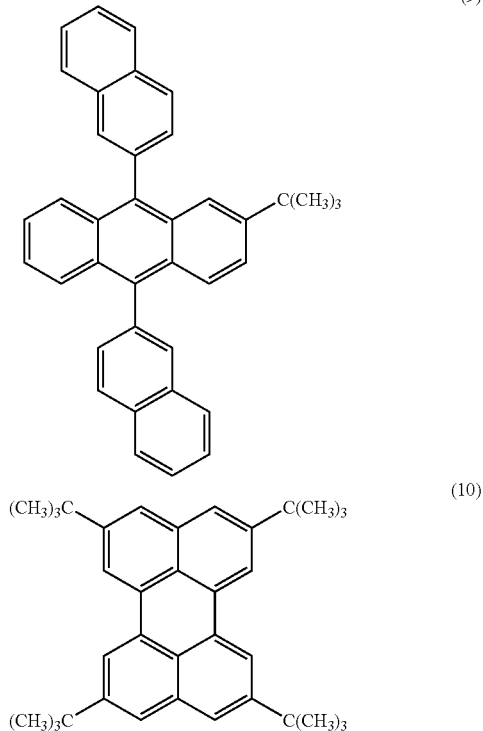

(9)

(10)

As the electron transport layer 7, a phenanthroline derivative, for example, 2,9-Dimethyl-4,7-diphenyl-1,10-phenanthroline (hereinafter referred to as "BCP") shown by the following formula (11) may be used. In this case, electrons can be efficiently injected to the blue light emitting layer 6 and the orange light emitting layer 5 due to high electron mobility in BCP. This enables driving voltage to be decreased, whereby power consumption in the organic EL element 100 can be reduced.

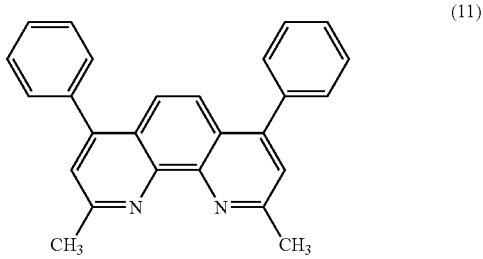

(11)

As the electron transport layer 7, Tris(8-hydroxyquinolinato)aluminum (hereinafter referred to as "Alq3") shown by the following formula (12) may be used, or alternatively the other organic material such as an oxadiazole derivative or a silole derivative may also be used.

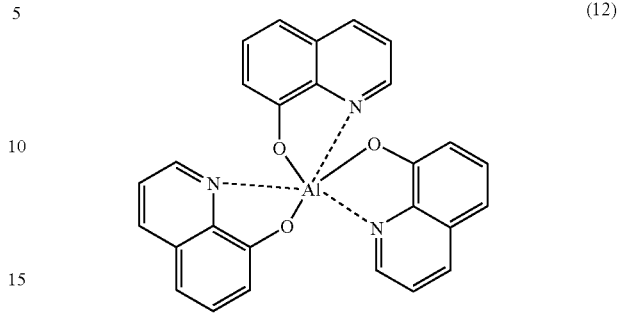

(12)

In the above-described organic EL element 100, holes are injected from the anode 2 and electrons are injected from the cathode 8 by applying a voltage between the anode 2 and the cathode 8. The holes are transported through the hole transport layer 4 and the intermediate layer 10 into the orange light emitting layer 5 and the blue light emitting layer 6, and the electrons are transported through the electron transport layer 7 into the blue light emitting layer 6 and the orange light emitting layer 5. Then, the holes and the electrons are recombined in the orange light emitting layer 5 and the blue light emitting layer 6, causing these layers to emit light. Consequently, white light is obtained.

As described above, forming the layered film 11, TFT 20, first interlayer insulation film 16, second interlayer insulation film 17, red color filter layer CFR, green color filter layer CFG, blue color filter layer CFB, first planarizing layer 18, second planarizing layer 19, and organic EL element 100 on the substrate 1 leads to the completion of an organic EL device having a bottom emission structure.

Light generated in the organic EL element 100 is extracted out through the red color filter layer CFR, the green color filter CFG, the blue color filter layer CFB, and the transparent substrate 1.

Now, operations of the intermediate layer 10 and the hole injection layer 3 are described, in relation to transporting electrons and holes while the organic EL element 100 is activated.

Figure 2:
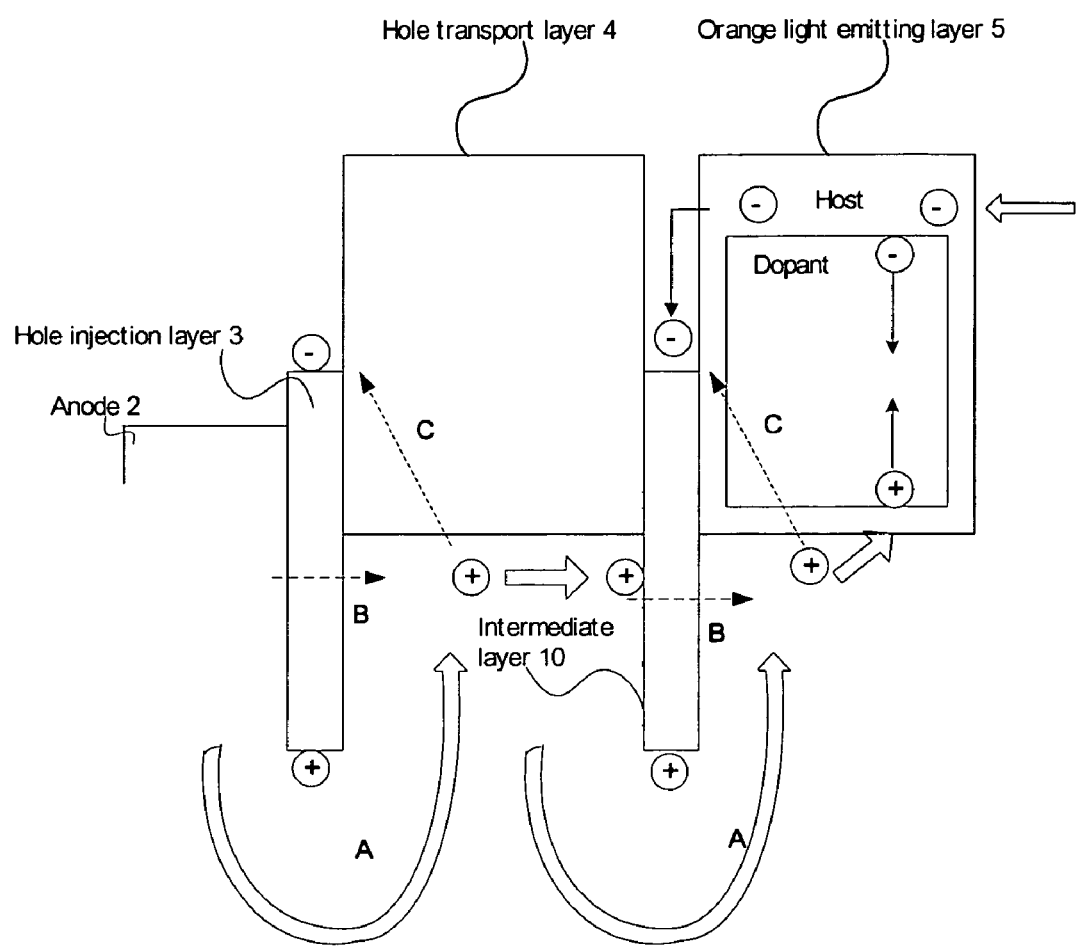
FIG. 2 is a diagram illustrating motions of electrons and holes in the case where a LUMO level of an intermediate layer 10 is lower than those of a hole transport layer 4 and a host material of an orange light emitting layer 5.

FIG. 2 is a diagram illustrating motions of electrons and holes in the case where a LUMO level of the intermediate layer 10 is lower than those of the hole transport layer 4 and the host material of the orange light emitting layer 5. In addition, FIG. 2 exemplifies the case where the hole transport layer 4 and the host material of the orange-light emitting layer 5 are comprised of a same material, and the hole injection layer 3 and the intermediate layer 10 are comprised of another same material; however, the same materials are not necessarily employed.

As described above, in the case where HAT-CN6 is used as the intermediate layer 10 and the hole injection layer 3, HAT-CN6 has the HOMO level of 7.0 eV and the LUMO level of 4.4 eV.

Also, in the case where NPB is used as the hole transport layer 4 and the host material of the orange light emitting layer 5, NPB has the LUMO level of 2.6 eV and the HOMO level of 5.4 eV.

Further, $CF_x$ has a LUMO level of 2.0 eV or lower and a HOMO level of 5.8 eV or higher.

In such a case, as shown in FIG. 2, because the LUMO level of the intermediate layer 10 is equal to or lower than that of the host material of the orange light emitting layer 5, electrons are moved from the host material of the orange light emitting layer 5 to the intermediate layer 10; however, because the LUMO level of the hole transport layer 4 is equal to or higher than that of the intermediate layer 10, the electrons having been moved from the host material of the orange light emitting layer 5 to the intermediate layer 10 are inhibited to move to the hole transport layer 4, and consequently trapped in the intermediate layer 10.

It can be considered that the holes having passed through the hole transport layer 4 follow paths described below. First, by following a first path (Path A in FIG. 2), the holes move to the intermediate layer 10 and then into the orange light emitting layer 5, where they are recombined with electrons. Also, because the intermediate layer 10 is a thin film, the holes directly move from the hole transport layer 4 into the orange light emitting layer 5 due to a tunneling effect by following a second path (Path B in FIG. 2), and then are recombined with electrons in the orange light emitting layer 5. Further, by following a third path, the holes move to the intermediate layer 10, where they are recombined with the trapped electrons to be thereby annihilated. In addition, even in the case where the electrons from the host material of the orange light emitting layer 5 are not recombined with the holes in the intermediate layer 10, the electrons are deactivated as they move within the intermediate layer 10.

Accordingly, the number of electrons entering the hole transport layer 4 is decreased. Consequently, the deterioration of the hole transport layer 4 is reduced, whereby a lifetime of the organic EL element is increased.

As described, the organic EL element 100 according to this embodiment enables the lifetime of the organic EL element 100 to be increased by the formation of the intermediate layer 10 as described above between the hole transport layer 4 and the orange light emitting layer 5.

It can also be considered that because the difference between the LUMO level of HAT-CN6 used as the intermediate layer 10 and the HOMO level of NPB used as the host material of the orange light emitting layer 5 is as small as 1.0 eV, the intermediate layer 10 attracts electrons from the adjacent orange light emitting layer 5 and generates holes in the orange light emitting layer 5. Therefore, the number of holes in the orange light emitting layer 5 is increased, whereby the rate of recombination with electrons is increased.

Consequently, with regard to the orange light emitting layer 5, the balance between the number of electrons injected from the electron injection layer 7 and the number of holes injected from the hole injection layer 3 and the intermediate layer 10 is improved, whereby a light emitting efficiency of the organic EL element 100 is improved.

On the other hand, it can be considered that because the difference between the LUMO level of HAT-CN6 used as the hole injection layer 3 and the HOMO level of NPB used as the hole transport layer 4 is as small as 1.0 eV, the hole injection layer 3 attracts electrons from the hole transport layer 4 and generates holes in the hole transport layer 4 (see C in FIG. 2). It can further be considered that the holes are moved into the orange light emitting layer 5 by an electric field in the organic EL element, and recombined with electrons in the orange light emitting layer 5, causing a light emission.

Therefore, with regard to the orange light emitting layer 5, the balance between the number of electrons injected from the electron injection layer 7 and the number of holes injected from the hole injection layer 3 and the intermediate layer 10 is further improved, whereby the light emitting efficiency of the organic EL element 100 is further improved.

That is, in the organic EL element 100 according to this embodiment, the recombination between electrons and holes effectively proceeds, whereby the light emitting efficiency is improved. In addition, preventing the deterioration of the hole transport layer 4 due to electrons uninvolved in the recombination enables the lifetime to be increased as well.

In the above description, the orange light emitting layer 5 and the blue light emitting layer 6 are formed to comprise a white light source as a light emitting layer; however, without being limited to this, a single light emitting layer may be used, or alternatively, a light emitting layer that generates light having a different wavelength may further be included.

In addition, the foregoing description explains about one pixel of a display device equipped with the organic EL element according to this embodiment; however, a size of the pixel may be increased, and the organic EL element may be used as a light emitting device having such a pixel.

A display device comprising the organic EL element according to this embodiment may have the following configuration.

Figure 3:
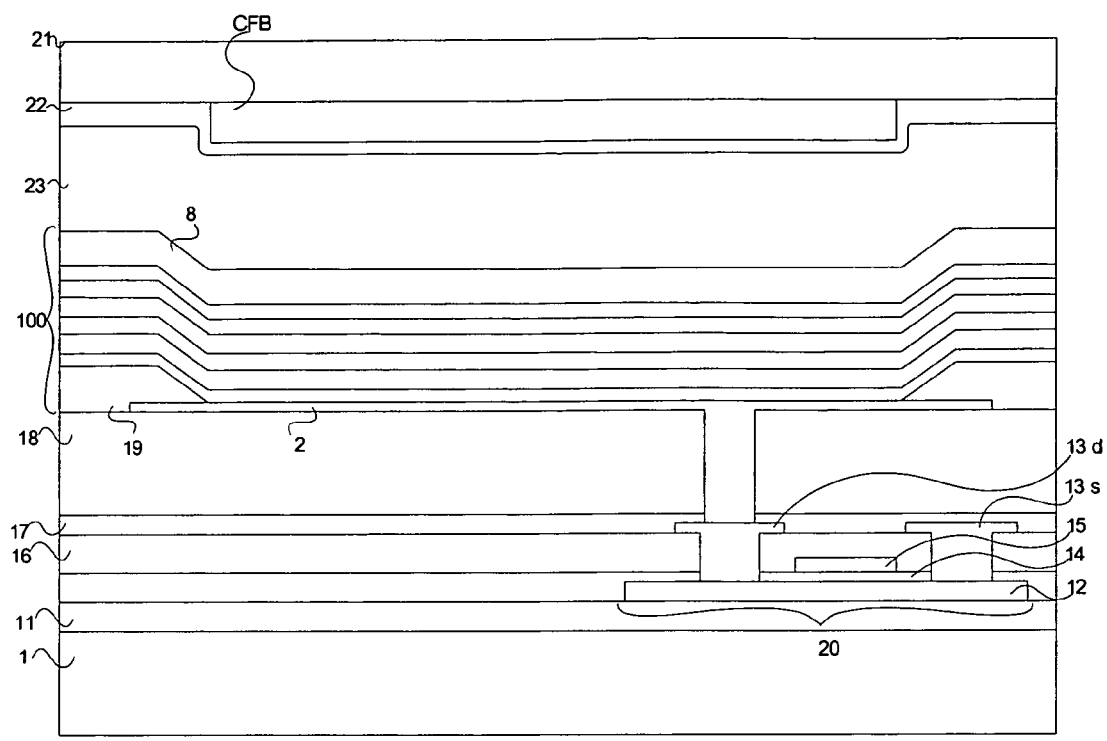
FIG. 3 is a schematic cross-sectional view illustrating an organic EL element according to another embodiment of the present invention.

FIG. 3 is a cross-sectional view illustrating an organic EL element, according to another embodiment, comprising one pixel of a display device equipped with the organic EL element. The display device in FIG. 3 is different in structure from that in FIG. 1 on the following point.

In the display device of FIG. 3, similarly to the display device of FIG. 1, a layered film 11, a TFT 20, a first interlayer insulation film 16, a second interlayer insulation film 17, a blue color filter layer CFB, a first planarizing layer 18, a second planarizing layer 19, and an organic EL element 100 are formed on a substrate 1. FIG. 3 also exemplifies the blue color filter layer CFB. The TFT 20 is formed on a part of the layered film 11. The TFT 20 is comprised of a channel region 12, a drain electrode 13d, a source electrode 13s, a gate oxide film 14, and a gate electrode 15.

Onto the organic EL element 100, a layered body in which an overcoat layer 22, the blue color filter layer CFB, and a transparent sealing substrate 21 are sequentially stacked is bonded via a transparent adhesive layer 23. This leads to the completion of the display device having a top emission structure.

Light generated in the organic EL element 100 is extracted out through a red color filter layer CFR, a green color filter layer CFG, the blue color filter layer CFB, and the transparent sealing substrate 21.

In the display device of FIG. 3, the substrate 1 may be formed with an opaque material. Also, an anode 2 of the organic EL element 100 is formed by stacking, for example, indium tin oxide (ITO) having a film thickness of approximately 50 nm and aluminum, chromium, or silver having a film thickness of approximately 100 nm. In this case, the anode 2 reflects the light generated in the organic EL element 100 toward the sealing substrate 21.

A cathode 8 is comprised of a transparent material. The cathode 8 is formed by stacking, for example, indium tin oxide (ITO) having a film thickness of approximately 100 nm and silver having a film thickness of approximately 20 nm.

The overcoat layer 22 is formed with, for example, an acrylic resin having a thickness of approximately 1 µm. Each of the red color filter layer CFR, the green color filter layer CFG, and the blue color filter layer CFB has a thickness of approximately 1 µm.

As the sealing substrate 21, for example, glass, a silicon oxide ($SiO_2$) layer, or a silicon nitride ($SiN_x$) layer may be used.

In the display device of FIG. 3, its top emission structure enables an area on the TFT 20 to be also used as a pixel area.

That is, in the display device of FIG. 3, the blue color filter layer CFB larger than that of FIG. 1 can be used. For this reason, a light emitting efficiency of the display device is improved because a wider area can be used as the pixel area.

EXAMPLES

Organic EL elements were prepared as examples and comparative examples, of which light emitting properties were measured.

Example 1

In Example 1, an organic EL element having the structure shown in FIG. 1 was fabricated as follows.

An indium tin oxide (ITO) layer was formed on the substrate 1 made of glass, followed by the formation of a $CF_x$ (carbon fluoride) layer on the ITO layer by a plasma CVD method, whereby the anode 2 having a double layer structure comprised of the ITO and carbon fluoride layers was formed. A plasma discharge time in the plasma CVD was 15 seconds in this case.

Further, onto the anode 2, the hole injection layer 3, hole transport layer 4, intermediate layer 10, orange light emitting layer 5, blue light emitting layer 6 and electron transport layer 7 were sequentially formed by vacuum evaporation.

The hole injection layer 3 is comprised of HAT-CN6 having a film thickness of 10 nm. The hole transport layer 4 is comprised of NPB having a film thickness of 100 nm. The intermediate layer 10 is comprised of HAT-CN6 having a film thickness of 10 nm, similarly to the hole injection layer 3.

The orange light emitting layer 5 has a film thickness of 30 nm, and was formed by adding a first dopant comprised of tBuDPN in an amount of 10 vol. % and a second dopant comprised of DBzR in an amount of 3 vol. % to a host material comprised of NPB.

The blue light emitting layer 6 has a film thickness of 40 nm, and was formed by adding a first dopant comprised of NPB in an amount of 20 vol. % and a second dopant comprised of TBP in an amount of 2.5 vol. % to a host material.

The electron transport layer 7 was formed by depositing a material having an electron transport property to a film thickness of 10 nm. The cathode 8 was formed so as to be a double layer structure by stacking a lithium fluoride (LiF) film having a thickness of 1 nm and an aluminum film having a thickness of 200 nm.

Example 2

In Example 2, an organic EL element same as that in Example 1 was prepared, except that a film thickness of NPB used as the hole transport layer 4 was 150 nm.

Example 3

In Example 3, an organic EL element same as that in Example 1 was prepared, except that a film thickness of NPB used as the hole transport layer 4 was 80 nm.

Example 4

In Example 4, an organic EL element same as that in Example 1 was prepared, except that a film thickness of HAT-CN6 used as the intermediate layer 10 was 5 nm.

Example 5

In Example 5, an organic EL element same as that in Example 1 was prepared, except that a film thickness of HAT-CN6 used as the hole injection layer 3 was 5 nm.

Example 6

In Example 6, an organic EL element same as that in Example 5 was prepared, except that a film thickness of HAT-CN6 used as the intermediate layer 10 was 5 nm.

Example 7

In Example 7, an organic EL element same as that in Example 1 was prepared, except that instead of Alq having a film thickness of 10 nm, BCP having a film thickness of 3 nm was used as the electron transport layer 7.

Example 8

In Example 8, an organic EL element same as that in Example 1 was prepared, except that a film thickness of HAT-CN6 used as the hole injection layer 3 was 30 nm and that a film thickness of HAT-CN6 used as the intermediate layer 10 was 30 nm.

Example 9

In Example 9, an organic EL element same as that in Example 1 was prepared, except that a film thickness of HAT-CN6 used as the hole injection layer 3 was 50 nm and that a film thickness of HAT-CN6 used as the intermediate layer 10 was 50 nm.

Example 10

In Example 10, an organic EL element same as that in Example 1 was prepared, except that instead of NPB, MTDATA was used as the hole transport layer 4 and that instead of NPB, MTDATA was used as the host material of the orange light emitting layer 5.

Example 11

In Example 11, an organic EL element same as that in Example 1 was prepared, except that the hole injection layer 3 was not provided.

Comparative Example 1

In Comparative Example 1, an organic EL element same as that in Example 1 was prepared, except that the intermediate layer 10 was not provided.

Comparative Example 2

In Comparative Example 2, an organic EL element same as that in Example 1 was prepared, except that the hole injection layer 3 and the intermediate layer 10 were not provided.

Example 12

In Example 12, an organic EL element same as that in Example 1 was prepared, except that instead of HAT-CN6, DTN was used as the hole injection layer 3 and that instead of HAT-CN6, DTN same as the material for the hole injection layer 3 was used as the intermediate layer 10.

Example 13

In Example 13, an organic EL element same as that in Example 1 was prepared, except that instead of HAT-CN6, DTN was used as the intermediate layer 10.

Example 14

In Example 14, an organic EL element same as that in Example 1 was prepared, except that instead of HAT-CN6, DTN was used as the hole injection layer 3.

Example 15

In Example 15, an organic EL element same as that in Example 1 was prepared, except that the orange light emitting layer 5 was not provided. This element is a blue light emitting element in which only the blue light emitting layer 6 emits light.

Configurations of the hole injection layer 3, hole transport layer 4, intermediate layer 10, orange light emitting layer 5, blue light emitting layer 6, and electron transport layer 7 of each of the organic EL elements in the above-described Examples 1 to 15 and Comparative Examples 1 and 2 are listed in Table 1. In addition, a numeric value appearing in a parenthesis following each material name indicates a film thickness (in nm unit) of each material.

The HOMO levels and LUMO levels of the materials used in the above-described Examples and Comparative Examples are listed in Table 2. The HOMO levels and LUMO levels in the table are measurable by a cyclic voltammetry measurement method (CV measurement method) described below.

First, regarding NPB, an ionization potential of a standard NPB material was measured in a thin film form with the use of an ionization potential measuring system (AC-2 manufactured by RIKEN KEIKI Co., Ltd.). The measured ionization potential of NPB was 5.4 eV.

Subsequently, oxidation and reduction potentials of NPB were measured on the basis of the CV measurement of it. The measured oxidation potential of NPB was +0.5 V, and the reduction potential of it was −2.3 V. Therefore, the HOMO level of NPB was calculated to be 5.4 eV, and the LUMO level of it be 2.6 eV (5.4−(0.5+2.3)=2.6). Also, regarding the measurements for other materials, for example, in the case of Alq, an oxidation potential was +0.8 V, and a reduction potential was −2.0 V. Accordingly, in the case of using NPB as a reference, the HOMO level of Alq was calculated to be 5.7 eV (5.4+(0.8−0.5)=5.7), and the LUMO level of it be 2.9 eV (5.7−(0.8+2.0)=2.9).

Also, HOMO levels and LUMO levels of other materials were similarly calculated.

In addition, the measurements of the oxidation and reduction potentials on the basis of the CV measurements were performed as follows.

For the oxidation potential measurement, a sample was prepared by using dichloromethane as a solvent, adding a

TABLE 1

| | Anode | Hole Injection Layer | Hole Transport Layer | Intermediate Layer | Orange Light Emitting Layer | Blue Light Emitting Layer | Electron Transport Layer | Cathode |
|---|---|---|---|---|---|---|---|---|
| Example 1 | ITO/CFx (30)/(1) | HAT-CN6 (10) | NPB(100) | HAT-CN6 (10) | NPB + 10% tBuDPN + 3.0% DBzR(30) | TBADN + 20% NPB + 2.5% TBP(40) | Alq (10) | LiF/Al (1)/(200) |
| Example 2 | ITO/CFx (30)/(1) | HAT-CN6 (10) | NPB(150) | HAT-CN6 (10) | NPB + 10% tBuDPN + 3.0% DBzR(30) | TBADN + 20% NPB + 2.5% TBP(40) | Alq (10) | LiF/Al (1)/(200) |
| Example 3 | ITO/CFx (30)/(1) | HAT-CN6 (10) | NPB(80) | HAT-CN6 (10) | NPB + 10% tBuDPN + 3.0% DBzR(30) | TBADN + 20% NPB + 2.5% TBP(40) | Alq (10) | LiF/Al (1)/(200) |
| Example 4 | ITO/CFx (30)/(1) | HAT-CN6 (10) | NPB(100) | HAT-CN6 (5) | NPB + 10% tBuDPN + 3.0% DBzR(30) | TBADN + 20% NPB + 2.5% TBP(40) | Alq (10) | LiF/Al (1)/(200) |
| Example 5 | ITO/CFx (30)/(1) | HAT-CN6 (5) | NPB(100) | HAT-CN6 (10) | NPB + 10% tBuDPN + 3.0% DBzR(30) | TBADN + 20% NPB + 2.5% TBP(40) | Alq (10) | LiF/Al (1)/(200) |
| Example 6 | ITO/CFx (30)/(1) | HAT-CN6 (5) | NPB(100) | HAT-CN6 (5) | NPB + 10% tBuDPN + 3.0% DBzR(30) | TBADN + 20% NPB + 2.5% TBP(40) | Alq (10) | LiF/Al (1)/(200) |
| Example 7 | ITO/CFx (30)/(1) | HAT-CN6 (10) | NPB(100) | HAT-CN6 (10) | NPB + 10% tBuDPN + 3.0% DBzR(30) | TBADN + 20% NPB + 2.5% TBP(40) | BCP (3) | LiF/Al (1)/(200) |
| Example 8 | ITO/CFx (30)/(1) | HAT-CN6 (30) | NPB(100) | HAT-CN6 (30) | NPB + 10% tBuDPN + 3.0% DBzR(30) | TBADN + 20% NPB + 2.5% TBP(40) | Alq (10) | LiF/Al (1)/(200) |
| Example 9 | ITO/CFx (30)/(1) | HAT-CN6 (50) | NPB(100) | HAT-CN6 (50) | NPB + 10% tBuDPN + 3.0% DBzR(30) | TBADN + 20% NPB + 2.5% TBP(40) | Alq (10) | LiF/Al (1)/(200) |
| Example 10 | ITO/CFx (30)/(1) | HAT-CN6 (10) | MTDATA(100) | HAT-CN6 (10) | MTDATA + 10% tBuDPN + 3.0% DBzR(30) | TBADN + 20% NPB + 2.5% TBP(40) | Alq (10) | LiF/Al (1)/(200) |
| Example 11 | ITO/CFx (30)/(1) | NON | NPB(100) | HAT-CN6 (10) | NPB + 10% tBuDPN + 3.0% DBzR(30) | TBADN + 20% NPB + 2.5% TBP(40) | Alq (10) | LiF/Al (1)/(200) |
| Example 12 | ITO/CFx (30)/(1) | DTN (10) | NPB(100) | DTN (10) | NPB + 10% tBuDPN + 3.0% DBzR(30) | TBADN + 20% NPB + 2.5% TBP(40) | Alq (10) | LiF/Al (1)/(200) |
| Example 13 | ITO/CFx (30)/(1) | HAT-CN6 (10) | NPB(100) | DTN (10) | NPB + 10% tBuDPN + 3.0% DBzR(30) | TBADN + 20% NPB + 2.5% TBP(40) | Alq (10) | LiF/Al (1)/(200) |
| Example 14 | ITO/CFx (30)/(1) | DTN (10) | NPB(100) | HAT-CN6 (10) | NPB + 10% tBuDPN + 3.0% DBzR(30) | TBADN + 20% NPB + 2.5% TBP(40) | Alq (10) | LiF/Al (1)/(200) |
| Example 15 | ITO/CFx (30)/(1) | HAT-CN6 (10) | NPB(100) | HAT-CN6 (10) | NON | TBADN + 20% NPB + 2.5% TBP(40) | Alq (10) | LiF/Al (1)/(200) |
| Comparative Example 1 | ITO/CFx (30)/(1) | HAT-CN6 (10) | NPB(100) | NON | NPB + 10% tBuDPN + 3.0% DBzR(30) | TBADN + 20% NPB + 2.5% TBP(40) | Alq (10) | LiF/Al (1)/(200) |
| Comparative Example 2 | ITO/CFx (30)/(1) | NON | NPB(100) | NON | NPB + 10% tBuDPN + 3.0% DBzR(30) | TBADN + 20% NPB + 2.5% TBP(40) | Alq (10) | LiF/Al (1)/(200) | supporting electrolyte of tert-butylammonium perchlorate to provide a concentration of $10^{-1}$ mol/l, and further adding a material to be measured to provide a concentration of $10^{-3}$ mol/l. The oxidation potentials were measured in an air atmosphere at room temperature.

For the reduction potential measurement, a sample was prepared by using tetrahydrofuran as a solvent, adding a supporting electrolyte of tert-butylammonium perchlorate to provide a concentration of $10^{-1}$ mol/l, and further adding a material to be measured to provide a concentration of $10^{-3}$ mol/l. The reduction potentials were measured in a nitrogen atmosphere at room temperature.

Results of the measurements performed on DTN, HAT-CN6, NPB, and MTDATA in the above-described manner are listed in Table 2.

TABLE 2

|         | HOMO (eV) | LUMO (eV) |
|---------|-----------|-----------|
| DTN     | 6.5       | 3.9       |
| HAT-CN6 | 7.0       | 4.4       |
| NPB     | 5.4       | 2.6       |
| MTDATA  | 5.0       | 2.5       |

Evaluation

Measurement results of driving voltages at 20 mA/cm$^2$, light emitting efficiencies, and lifetimes of the organic EL elements in Examples 1 to 15 and Comparative Examples 1 and 2 prepared as above are listed in Table 3. The lifetime represents a time period for the brightness of 10000 cd/m$^2$ at the start of the measurement to be decreased by half, and the driving voltage was measured when the organic EL element was driven at 20 mA/cm$^2$.

TABLE 3

|                        | Light Emitting Efficiency (cd/A) | Lifetime (Hr) |
|------------------------|----------------------------------|---------------|
| Example 1              | 13.6                             | 910           |
| Example 2              | 13.3                             | 880           |
| Example 3              | 14.0                             | 880           |
| Example 4              | 13.3                             | 780           |
| Example 5              | 13.5                             | 800           |
| Example 6              | 13.6                             | 770           |
| Example 7              | 13.3                             | 660           |
| Example 8              | 13.0                             | 820           |
| Example 9              | 12.8                             | 740           |
| Example 10             | 13.5                             | 820           |
| Example 11             | 12.5                             | 610           |
| Example 12             | 12.6                             | 650           |
| Example 13             | 12.9                             | 660           |
| Example 14             | 13.0                             | 710           |
| Example 15             | 10.2                             | 320           |
| Comparative Example 1  | 11.8                             | 480           |
| Comparative Example 2  | 11.1                             | 450           |

Operational effects of Examples are described below in comparison with Comparative Examples.

In comparison between Example 1 and Comparative Example 1, the lifetime of the element in Example 1, which is provided with HAT-CN6 as the intermediate layer 10, is longer than that in Comparative Example 1, which is not provided with the intermediate layer 10. That is, it can be appreciated that a time period for the brightness to be decreased by half is increased by 910/480=approximately 190%.

In Example 1, the LUMO level of NPB used as the hole transport layer 4 is 2.6 eV, that of HAT-CN6 used as the intermediate layer is 4.4 eV, and that of NPB used as the host material of the orange light emitting layer 5 coming into contact with the intermediate layer 10 is 2.6 eV, i.e., the intermediate layer 10 has the LUMO level lower than those of the hole transport layer 4 and the light emitting layer 5.

Because providing the intermediate layer 10 comprised of a material having such a LUMO level causes electrons flowing in from the orange light emitting layer 5 to be trapped in the intermediate layer 10, where the electrons are recombined with holes moving in from the hole transport layer 4, so that the electrons can be prevented from moving into the hole transport layer 4. Therefore, it is considered that the deterioration of the hole transport layer 4 caused by electrons is reduced, whereby the lifetime of the organic EL element is increased.

Further, it can be appreciated that the organic EL element in Example 1 has an improved light emitting efficiency and an increased life time in comparison with that in Example 11, which is not provided with the hole injection layer 3, because the element in Example 1 is provided with the hole injection layer 3 as well as the intermediate layer 10 comprised of a material having such a LUMO level.

The LUMO level of HAT-CN6 used as the intermediate layer 10 is 4.4 eV, and the HOMO level of NPB used as the orange light emitting layer 5 coming into contact with the intermediate layer 10 is 5.4 eV, i.e., the difference in energy level between these layers is 1.0 eV. This value is smaller than 1.5 eV, i.e., the LUMO level of the intermediate layer 10 and the HOMO level of the orange light emitting layer 5 are close to each other, and therefore electrons are attracted by the intermediate layer 10, whereby electrons and holes are separated, and the holes are generated in the light emitting layer 5, which are used for the recombination with electrons in the light emitting layer to thereby contribute to the improvement of a light emitting efficiency. At this time, the electrons attracted to the intermediate layer 10 are confined in a potential wall formed between the hole transport layer 4 and the orange light emitting layer 5, similarly to the electrons having passed through the light emitting layer as described, and eventually recombined with holes in the intermediate layer 10. Excitons generated by such a recombination are to be deactivated without radiation.

As described above, the organic EL element in Example 1 provides not only a first effect of trapping electrons but also a second effect of supplying holes to the orange light emitting layer 5 to thereby facilitate the recombination with electrons, due to the presence of the intermediate layer 10, so that the deterioration of the hole transport layer 4 can be inhibited by the collaboration of the two effects. That is, while the second effect reduces the number of electrons passing through the orange light emitting layer 5, the first effect can trap electrons having passed through the orange light emitting layer 5 so as to prevent the electrons from moving to the hole transport layer, so that the deterioration of the hole transport layer 4 due to electrons can be inhibited, and the longer lifetime of the organic EL element can be provided. It will be understood that the improvement in light emitting efficiency by the second effect can be expected.

Further, in Example 1, the HOMO level of NPB used as the hole transport layer 4 is 5.4 eV, and the LUMO level of HAT-CN6 used as the hole injection layer 3 is 4.4 eV, i.e., the difference in energy level between these layers is 1.0 eV. This value is smaller than 1.5 eV, i.e., the LUMO level of the hole injection layer 3 and the HOMO level of the hole transport layer 4 are close to each other, and therefore electrons are attracted by the hole injection layer 3, whereby electrons and holes are separated, and the holes are generated in the hole transport layer 4, which are supplied to the orange light emitting layer 5 along with holes injected from the anode 3 to be used for the recombination with electrons in the orange light emitting layer. This supports the fact that the light emitting efficiency of the element in Example 1 provided with the above-described hole injection layer is higher than that in Example 11 not provided with such a hole injection layer 3.

Now, regarding the film thicknesses of the intermediate layer 10 and the hole injection layer 3, Examples 1, 4 to 6, 8, and 9 are described.

In Examples 1, 6, 8, and 9, HAT-CN6 having the same film thickness is used as the hole transport layer 4, and the film thicknesses of the hole injection layer 3 and the intermediate layer 10 are different among respective Examples. It can be appreciated that the lifetime of the organic EL element increases as the film thickness of HAT-CN6 is varied in the order of 50 nm, 5 nm, 30 nm, and 10 nm, and the lifetime is maximized at the thickness of 10 nm.

The film thicknesses of the hole injection layer 3 and the intermediate layer 10 in Examples 4 and 5 are different from those in Example 6, and also different from those in Example 1. It is clear that the lifetimes of the organic EL elements in Examples 4 and 5 are longer than that in Example 6, but are shorter than that in Example 1. It can be appreciated from these results that preferable film thicknesses of HAT-CN6 used as the hole injection layer 3 and the intermediate layer 10 are both 10 nm.

In comparison between Example 12 and Comparative Example 2, it is clear that the lifetime of the organic EL element in Example 12 is longer, and therefore the lifetime of the organic EL element can be increased also by using DTN as the hole injection layer 3 and the intermediate layer 10.

Further, in comparison between Example 13 and Comparative Example 1, it is clear that the lifetime of the organic EL element is longer in the case of providing the intermediate layer 10 comprised of DTN rather than the case of not providing the intermediate layer 10. From this result, it can be appreciated that the lifetime of the organic EL becomes longer also in the case where the hole injection layer 3 and the intermediate layer 10 are comprised of different materials respectively.

Similarly, in comparison between Example 11 and Example 14, it is clear that the lifetime of the organic EL element is longer in the case of providing the hole injection layer 3 comprised of DTN rather than the case of not providing the hole injection layer 3. Also from this result, it can be appreciated that the lifetime of the organic EL element becomes longer in the case where the hole injection layer 3 and the intermediate layer 10 are comprised of different pyrazine derivative materials respectively.

Further, in comparison among Examples 1 and 12 to 14, it is clear that the lifetime of the organic EL element is longer in the case of using HAT-CN6 rather than DTN as the hole injection layer 3 and the intermediate layer 10. The HOMO level of NPB used as the hole transport layer 4 and the host material of the orange light emitting layer 5 coming into contact with the intermediate layer 10 is 5.4 eV, and the LUMO levels of DTN and HAT-CN6 used as the hole injection layer 3 or the intermediate layer 10 are 3.9 eV and 4.4 eV respectively. That is, the differences between the HOMO level of NPB and the LUMO levels of HAT-CN6 and DTN are 1.0 eV and 1.5 eV respectively, i.e., the LUMO level of HAT-CN6 is closer to the HOMO level of NPB than the LUMO level of DTN. Therefore, it can be considered that this makes the aforementioned second effect larger, so that the lifetime of the organic EL element is longer when HAT-CN6 is used rather than DTN.

Still further, in comparison among Examples 1 to 3, it is clear that among the film thicknesses of 80 nm, 100 nm, and 150 nm of NPB used as the hole transport layer 4, the lifetime of the organic EL element is maximized at 100 nm. It can be appreciated from this result that a preferable film thickness of NPB used as the hole transport layer 4 is 100 nm.

Still further, in comparison between Example 10 and Comparative Example 2, it can be appreciated that the lifetime of the organic EL element becomes longer if the hole injection layer 3 and the intermediate layer 10 both comprised of HAT-CN6 are provided, even in the case of using MTDATA (an amine derivative, similarly to NPB) instead of NPB as the hole transport layer 4.

Still further, in comparison between Example 1 and Example 10, it is clear that the lifetime of the organic EL element is longer when NPB is used as the hole transport layer 4. It can be appreciated from this result that a more preferable material for the hole transport layer 4 is NPB.

The organic electroluminescent element and the display device or the light emitting device equipped with the element according to the present invention enable the number of electrons entering the hole transport layer to be reduced, whereby the deterioration of the hole transport layer is reduced, so that the lifetimes of the organic electroluminescent element and the display device or the light emitting device equipped with the element can be increased.

The organic electroluminescent element and the display device or the light emitting device equipped with the element according to the present invention are not limited to the above-described embodiments or examples, but they include techniques in which configuration requirements of the embodiments or the examples are substituted, added, or modified, and all equivalents. For example, the above-described organic electroluminescent element structures, and materials and film thicknesses of the hole injection layer 3, the hole transport layer 4, and the intermediate layer 10 are not limited to the description herein.

What is claimed is:

1. An organic electroluminescent element comprising a light emitting layer including an organic material between an anode and a cathode, comprising:
   a hole transport layer provided between the anode and the light emitting layer;
   an intermediate layer provided between the hole transport layer and the light emitting layer, wherein the intermediate layer has an energy level of a lowest unoccupied molecular orbital lower than energy levels of lowest unoccupied molecular orbitals of the hole transport layer and the light emitting layer;
   wherein the intermediate layer has an energy level of a highest occupied molecular orbital lower than energy levels of highest occupied molecular orbitals of the hole transport layer and the light emitting layer;
   wherein a difference between an energy level of a highest occupied molecular orbital of the light emitting layer and the energy level of the lowest unoccupied molecular orbital of the intermediate layer is approximately 1.5 eV or less;
   wherein the hole transport layer and the intermediate layer contact each other and the intermediate layer and light emitting layer contact each other; and
   further comprising a hole injection layer between the anode and the hole transport layer, wherein a difference between an energy level of a highest occupied molecular orbital of the hole transport layer and an energy level of a lowest unoccupied molecular orbital of the hole injection layer is approximately 1.5 eV or less;

wherein the intermediate layer and the hole injection layer are comprised of a same material.

2. An organic electroluminescent element comprising:
an anode;
a hole transport layer including an amine derivative;
a light emitting layer;
an electron transport layer; and
an intermediate layer provided between the hole transport layer and the light emitting layer; wherein
the intermediate layer at least includes a pyrazine derivative having a molecular structure shown by formula (1):

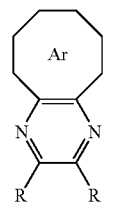

(1)

Pyrazine Derivative
Ar: aryl group
R: —H, —CnH2n+1 (n = 1 ~ 10)
—OCnH2n+1 (n = 1 ~ 10),
—N(CnH2n+1)2 (n = 1 ~ 10),
—X(X = F, Cl, Br, I), —CN, wherein a difference between an energy level of a highest occupied molecular orbital of the light emitting layer and the energy level of the lowest unoccupied molecular orbital of the intermediate layer is approximately 1.5 eV or less, and
wherein the hole transport layer and the intermediate layer contact each other and the intermediate layer and light emitting layer contact each other.

3. The organic electroluminescent element according to claim 2, wherein the pyrazine derivative at least includes a material having a molecular structure shown by formula (2):

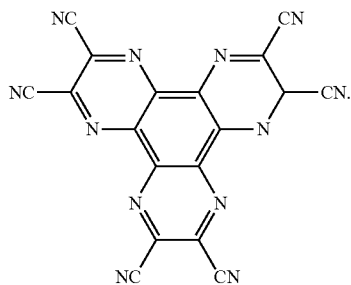

(2)

4. The organic electroluminescent element according to claim 2, wherein the organic electroluminescent element is included in a device selected from a group consisting of: a display device and a light emitting device.

5. The organic electroluminescent element according to claim 2, further comprising a hole injection layer between the anode and the hole transport layer, wherein a difference between an energy level of a highest occupied molecular orbital of the hole transport layer and an energy level of a lowest unoccupied molecular orbital of the hole injection layer is approximately 1.5 eV or less.

6. The organic electroluminescent element according to claim 5, wherein the intermediate layer and the hole injection layer are comprised of a same material.

7. An organic electroluminescent element comprising:
an anode;
a hole transport layer including an amine derivative;
a light emitting layer;
an electron transport layer; and
an intermediate layer provided between the hole transport layer and the light emitting layer; wherein
the intermediate layer at least includes a material having a molecular structure shown by formula (3):

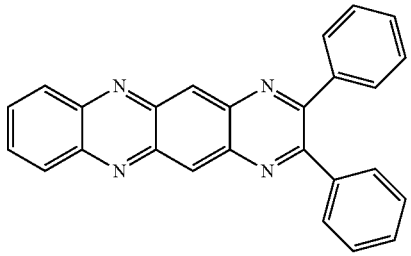

(3)

8. The organic electroluminescent element according to claim 7, wherein the organic electroluminescent element is included in a device selected from a group consisting of: a display device and a light emitting device.

9. The device according to claim 7, wherein a difference between an energy level of a highest occupied molecular orbital of the light emitting layer and an energy level of a lowest unoccupied molecular orbital of the intermediate layer is approximately 1.5 eV or less.

10. The organic electroluminescent element according to claim 7, wherein the intermediate layer and a hole injection layer are comprised of a same material.

* * * * *